(12) United States Patent
Niwa et al.

(10) Patent No.: US 11,387,385 B2
(45) Date of Patent: Jul. 12, 2022

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 79 days.

(21) Appl. No.: 16/996,368

(22) Filed: Aug. 18, 2020

(65) Prior Publication Data
US 2021/0057609 A1    Feb. 25, 2021

(30) Foreign Application Priority Data
Aug. 21, 2019 (JP) .............................. JP2019-151151

(51) Int. Cl.
| | |
|---|---|
| *H01L 33/32* | (2010.01) |
| *H01L 33/38* | (2010.01) |
| *H01L 33/00* | (2010.01) |
| *H01L 33/36* | (2010.01) |
| *H01L 33/44* | (2010.01) |
| *H01L 33/40* | (2010.01) |

(52) U.S. Cl.
CPC .......... *H01L 33/32* (2013.01); *H01L 33/0075* (2013.01); *H01L 33/36* (2013.01); *H01L 33/38* (2013.01); *H01L 33/385* (2013.01); *H01L 33/387* (2013.01); *H01L 33/405* (2013.01); *H01L 33/44* (2013.01); *H01L 2933/0016* (2013.01)

(58) Field of Classification Search
CPC ... H01L 33/32; H01L 33/0075; H01L 33/387; H01L 33/38; H01L 33/44; H01L 33/405
See application file for complete search history.

(56) References Cited

U.S. PATENT DOCUMENTS

| | | | |
|---|---|---|---|
| 7,723,743 B2 * | 5/2010 | Yahata | H01L 33/40 257/E33.068 |
| 8,492,186 B2 * | 7/2013 | Shinohara | H01L 21/0254 438/42 |
| 11,227,976 B2 * | 1/2022 | Niwa | H01L 33/0075 |

(Continued)

FOREIGN PATENT DOCUMENTS

| | | |
|---|---|---|
| JP | 2007300063 A | 11/2007 |
| WO | WO-2018/105975 A1 | 6/2018 |

*Primary Examiner* — Savitri Mulpuri
(74) *Attorney, Agent, or Firm* — Muncy, Geissler, Olds & Lowe, P.C.

(57) ABSTRACT

A semiconductor light-emitting element includes: an n-type semiconductor layer made of an n-type AlGaN-based semiconductor material; an active layer made of an AlGaN-based semiconductor material provided on the n-type semiconductor layer; a p-type semiconductor layer provided on the active layer; a p-side contact electrode made of Rh and in contact with the p-type semiconductor layer; a p-side electrode covering layer made of TiN that covers the p-side contact electrode; a dielectric protective layer that covers the n-type semiconductor layer, the active layer, the p-type semiconductor layer, and the p-side electrode covering layer; and a p-side pad electrode in contact with the p-side electrode covering layer in a p-side opening that extends through the dielectric protective layer on the p-side contact electrode.

6 Claims, 4 Drawing Sheets

(56) References Cited

U.S. PATENT DOCUMENTS

| | | | |
|---|---|---|---|
| 2003/0138981 A1* | 7/2003 | Yamaguchi | H01S 5/04252 |
| | | | 438/22 |
| 2005/0199888 A1 | 9/2005 | Seong et al. | |
| 2015/0333230 A1 | 11/2015 | Moon et al. | |
| 2019/0067526 A1* | 2/2019 | Kim | H01L 33/46 |
| 2020/0066936 A1* | 2/2020 | Hwang | G01N 17/004 |
| 2020/0395506 A1* | 12/2020 | Inazu | H01L 33/42 |
| 2021/0036187 A1* | 2/2021 | Lee | H01L 33/0093 |

* cited by examiner

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2019-151151, filed on Aug. 21, 2019, the entire content of which is incorporated herein by reference.

BACKGROUND OF THE INVENTION

1. Field of the Invention

The present invention relates to a semiconductor light-emitting element and a method of manufacturing a semiconductor light-emitting element.

2. Description of the Related Art

A semiconductor light-emitting element includes an n-type semiconductor layer, an active layer, and a p-type semiconductor layer stacked on a substrate, and a p-side electrode is provided on the p-type semiconductor layer. In a semiconductor light-emitting element in which a nitride semiconductor such as GaN and AlGaN is used, Rh, Pt, or the like having a high reflection efficiency for the emission wavelength is selected as a material for the p-side electrode. Further, an insulative protection film is formed on the surface of the p-side electrode.

The adhesion of platinum group metals such as Rh and Pt with the dielectric protective layer that covers the surface of the p-side electrode is not high. Therefore, the dielectric protective layer is easily exfoliated from the p-side electrode, which could possibly result in lower reliability of the light-emitting element.

SUMMARY OF THE INVENTION

The present invention addresses the above-described issue, and an illustrative purpose thereof is to improve the reliability of a semiconductor light-emitting element.

A semiconductor light-emitting element according to an embodiment of the present invention includes: an n-type semiconductor layer made of an n-type AlGaN-based semiconductor material; an active layer made of an AlGaN-based semiconductor material provided on the n-type semiconductor layer; a p-type semiconductor layer provided on the active layer; a p-side contact electrode made of Rh and in contact with the p-type semiconductor layer; a p-side electrode covering layer made of TiN that covers the p-side contact electrode; a dielectric protective layer that covers the n-type semiconductor layer, the active layer, the p-type semiconductor layer, and the p-side electrode covering layer; and a p-side pad electrode in contact with the p-side electrode covering layer in a p-side opening that extends through the dielectric protective layer on the p-side contact electrode.

By providing the p-side electrode covering layer made of TiN between the p-side contact electrode made of Rh and the dielectric protective layer, the adhesion of the dielectric protective layer with the p-side contact electrode is enhanced. This prevents exfoliation of the dielectric protective layer from the p-side contact electrode, maintains the sealing performance exhibited by the dielectric protective layer, and increases the reliability of the semiconductor light-emitting element.

The p-side electrode covering layer may cover an upper surface and a side surface of the p-side contact electrode and may be in contact with the p-type semiconductor layer.

The semiconductor light-emitting element may further include: an n-side contact electrode provided in a region on the n-type semiconductor layer different from a region in which the active layer is formed; an n-side electrode covering layer made of TiN that covers the n-side contact electrode; and an n-side pad electrode in contact with the n-side electrode covering layer in an n-side opening that extends through the dielectric protective layer on the n-side contact electrode.

A difference between positions of an upper surface of the p-side contact electrode and an upper surface of the n-side contact electrode in a direction of thickness may be 100 nm or smaller.

The semiconductor light-emitting element may further include a patterned sapphire substrate in which a concave-convex pattern is formed on a principal surface. The n-type semiconductor layer is provided on the principal surface of the patterned sapphire substrate.

Another embodiment of the present invention relates to a method of manufacturing a semiconductor light-emitting element. The method includes: forming an active layer made of an AlGaN-based semiconductor material on an n-type semiconductor layer made of an n-type AlGaN-based semiconductor material; forming a p-type semiconductor layer on the active layer; removing a portion of the p-type semiconductor layer and the active layer to expose a partial region on the n-type semiconductor layer; forming a p-side contact electrode made of Rh on the p-type semiconductor layer; forming a p-side electrode covering layer made of TiN that covers the p-side contact electrode; forming a dielectric protective layer that covers the n-type semiconductor layer, the active layer, the p-type semiconductor layer, and the p-side electrode covering layer; and forming a p-side opening that extends through the dielectric protective layer on the p-side contact electrode; and forming a p-side pad electrode in contact with the p-side electrode covering layer in the p-side opening.

By providing the p-side electrode covering layer made of TiN between the p-side contact electrode made of Rh and the dielectric protective layer, the adhesion of the dielectric protective layer with the p-side contact electrode is enhanced. Further, TiN that forms the p-side electrode covering layer is not easily etched, and by-products from etching are not easily produced in the step of etching the dielectric protective layer to form the p-side opening. Consequently, proper electric connection between the p-side contact electrode and the p-side pad electrode is realized, and the reliability of the semiconductor light-emitting element is increased.

The p-side electrode covering layer may be formed by sputtering.

The method may further include: forming an n-side contact electrode in the partial region on the n-type semiconductor layer; forming an n-side electrode covering layer made of TiN that covers the n-side contact electrode; forming an n-side opening that extends through the dielectric protective layer on the n-side contact electrode; and forming an n-side pad electrode in contact with the n-side electrode covering layer in the n-side opening. The p-side electrode covering layer and the n-side electrode covering layer may be formed concurrently.

DETAILED DESCRIPTION OF THE INVENTION

The invention will now be described by reference to the preferred embodiments. This does not intend to limit the scope of the present invention, but to exemplify the invention.

A detailed description will be given of an embodiment of the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light-emitting element.

The semiconductor light-emitting element according to the embodiment is configured to emit "deep ultraviolet light" having a central wavelength λ of about 360 nm or shorter and is a so-called deep ultraviolet light-emitting diode (DUV-LED) chip. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" contain GaN or InGaN. Similarly, those materials that do not contain GaN may be distinguished by referring to them as "AlN-based semiconductor materials". "AlN-based semiconductor materials" contain AlN or InAlN.

Figure 1:
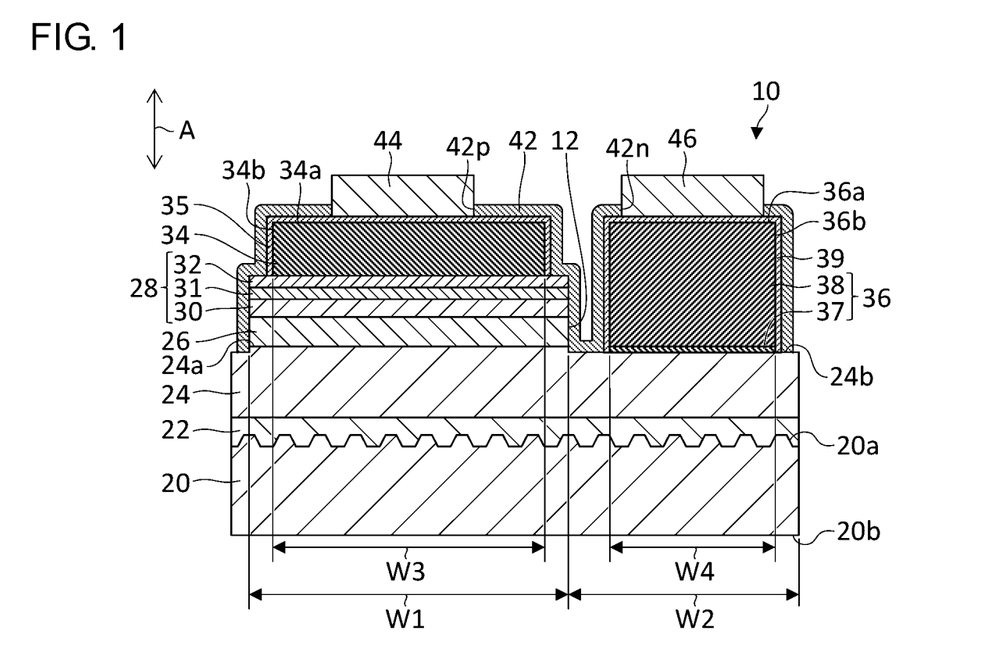
FIG. 1 is a cross sectional view schematically showing a configuration of a semiconductor light-emitting element according to the embodiment.

FIG. 1 is a cross sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, a p-side contact electrode 34, a p-side electrode covering layer 35, an n-side contact electrode 36, an n-side electrode covering layer 39, a dielectric protective layer 42, a p-side pad electrode 44, and an n-side pad electrode 46.

Referring to FIG. 1, the direction indicated by the arrow A may be referred to as "vertical direction" or "direction of thickness". In a view of the substrate 20, the direction away from the substrate 20 may be referred to as upward, and the direction toward the substrate 20 may be referred to as downward.

The substrate 20 is a substrate having translucency for the deep ultraviolet light emitted by the semiconductor light-emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the layers from the base layer 22 to the p-type semiconductor layer 28. A fine concave-convex pattern having a submicron (1 μm or less) depth and pitch is formed on the first principal surface 20a. The substrate 20 like this is also called a patterned sapphire substrate (PSS). The second principal surface 20b is a principal surface that is a light extraction substrate for extracting the deep ultraviolet light emitted by the active layer 26 outside. The substrate 20 may be an AlN substrate or an AlGaN substrate.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN layer grown at a high temperature (HT-AlN; High Temperature AlN). The base layer 22 may include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer and an undoped AlGaN layer.

The n-type semiconductor layer 24 is provided on the base layer 22. The n-type semiconductor layer 24 is an n-type AlGaN-based semiconductor material layer. For example, the n-type semiconductor layer 24 is an AlGaN layer doped with silicon (Si) as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferable to form the n-type semiconductor layer 24 such that the molar fraction of AlN is 80% or lower, i.e., the band gap is 5.5 eV or smaller. It is more preferable to form the n-type semiconductor layer 24 such that the molar fraction of AlN is 70% or lower (i.e., the band gap is 5.2 eV or smaller). The n-type semiconductor layer 24 has a thickness of about 1 μm-3 μm. For example, the n-type semiconductor layer 24 has a thickness of about 2 μm.

The n-type semiconductor layer 24 is formed such that the concentration of Si as the impurity is not lower than $1\times10^{18}/cm^3$ and not higher than $5\times10^{19}/cm^3$. It is preferred to form the n-type semiconductor layer 24 such that the Si concentration is not lower than $5\times10^{18}/cm^3$ and not higher than $3\times10^{19}/cm^3$, and, preferably, not lower than $7\times10^{18}/cm^3$ and not higher than $2\times10^{19}/cm^3$. In one example, the Si concentration in the n-type semiconductor layer 24 is around $1\times10^{19}/cm^3$ and is in a range not lower than $8\times10^{18}/cm^3$ and not higher than $1.5\times10^{19}/cm^3$.

The n-type semiconductor layer 24 includes a first upper surface 24a and a second upper surface 24b. The first upper surface 24a is where the active layer 26 is formed, and the second upper surface 24b is where the active layer 26 is formed. The first upper surface 24a and the second upper surface 24b may have different heights, and the height from the substrate 20 to the first upper surface 24a is larger than the height from the substrate 20 to the second upper surface 24b. The region where the first upper surface 24a is located is defined as "first region W1", and the region where the second upper surface 24b is located is defined as "second region W2". The second region W2 is adjacent to the first region W1.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 320 nm or shorter.

The active layer 26 may have, for example, a monolayer or multilayer quantum well structure. The active layer 26 is comprised of a stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. The barrier layer and the well layer has a thickness of about 1 nm-20 nm, and has a thickness of, for example, about 2 nm-10 nm.

The active layer 26 may further include an electron blocking layer directly in contact with the p-type semiconductor layer 28. The electron blocking layer is an undoped AlGaN-based semiconductor material layer and is formed such that the molar fraction of AlN is 40% or higher, and, preferably, 50% or higher. The electron blocking layer may be formed such that the molar fraction of AlN is 80% or higher or may be made of an AlN-based semiconductor material that does not contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 includes a p-type first clad layer 30, a p-type second clad layer 31, and a p-type contact layer 32. The p-type first clad layer 30, the p-type second clad layer 31, and the p-type contact layer 32 are formed such that their AlN ratios (proportions of AlN) differ.

The p-type first clad layer 30 is a p-type AlGaN layer having relatively higher AlN ratio as compared with the p-type second clad layer 31 and the p-type contact layer 32. The p-type first clad layer 30 has a relatively high AlN ratio in the p-type semiconductor layer 28, and the AlN composition ratio of p-type first clad layer 30 is selected to transmit the deep ultraviolet light emitted by the active layer 26. The p-type first clad layer 30 is formed such that the molar fraction of AlN is 40% or higher, and, preferably, 50% or higher, or 60% or higher. The AlN ratio of the p-type first clad layer 30 is, for example, similar to the AlN ratio of the n-type semiconductor layer 24 or larger than the AlN ratio of the n-type semiconductor layer 24. The AlN ratio of the p-type first clad layer 30 may be 70% or higher, or 80% or higher. The p-type first clad layer 30 has a thickness of about 20 nm-100 nm and has a thickness of, for example, about 30 nm-70 nm.

The p-type second clad layer 31 is a p-type AlGaN layer has an AlN ratio lower than the AlN ratio of the p-type first clad layer 30 and higher than the AlN ratio of the p-type contact layer 32. In other words, the p-type second clad layer 31 has a medium AlN ratio in the p-type semiconductor layer 28. For example, the p-type second clad layer 31 is formed such that the molar fraction of AlN is 25% or higher, and, preferably, 40% or higher, or 50% or higher. The AlN ratio of the p-type second clad layer 31 is configured to be, for example, about ±10% of the AlN ratio of the n-type semiconductor layer 24. The second clad layer 31 has a thickness of about 5 nm-50 nm and has, for example, a thickness of about 10 nm-30 nm. The p-type second clad layer 31 may not be provided.

The p-type contact layer 32 is a p-type AlGaN layer or a p-type GaN layer having a relatively low AlN ratio as compared with the p-type first clad layer 30 and the p-type second clad layer 31. In other words, the p-type contact layer 32 has a relatively low AlN ratio in the p-type semiconductor layer 28. The p-type contact layer 32 is formed such that the AlN ratio is 20% or lower in order to obtain proper ohmic contact with the p-side contact electrode 34. Preferably, the p-type contact layer 32 is formed such that the AlN ratio is 10% or lower, 5% or lower, or 0%. In other words, the p-type contact layer 32 may be made of a p-type GaN-based semiconductor material that does not substantially contain AlN. The second clad layer 31 has a thickness of about 5 nm-30 nm and has a thickness of about 10 nm-20 nm.

The p-side contact electrode 34 is provided on the p-type semiconductor layer 28. The p-side contact electrode 34 can be in ohmic contact with the p-type semiconductor layer 28 (i.e., the p-type contact layer 32) and is made of a material having a high reflectivity for the deep ultraviolet light emitted by the active layer 26. The material having such a property is limited. Our knowledge shows that rhodium (Rh) can be used. By configuring the p-side contact electrode 34 as an Rh layer, the contact resistance relative to the p-type contact layer 32 can be $1\times10^{-2}$ $\Omega \cdot cm^2$ or smaller (e.g., $1\times10^4$ $\Omega \cdot cm^2$ or smaller), and the reflectivity of 60% or higher (e.g., about 60%-65%) for ultraviolet light having a wavelength of 280 nm can be obtained. In this case, it is preferred that the thickness of the Rh layer forming the p-side contact electrode 34 be 50 nm or larger or 100 nm or larger.

The p-side contact electrode 34 is formed inside the first region W1. The region in which the p-side contact electrode 34 is formed is defined as "third region W3". The p-side contact electrode 34 is formed to be in ohmic contact with the p-type semiconductor layer 28 over the entirety of the third region W3 and to have a high reflectivity for deep ultraviolet light over the entirety of the third region W3. It is preferred that the p-side contact electrode 34 be formed to have a uniform thickness over the entirety of the third region W3. This allows the p-side contact electrode 34 to function as a highly efficient reflection electrode that reflects the deep ultraviolet light from the active layer 26 and guides it toward the second principal surface 20*b* of the substrate 20 and to function as a low-resistance contact electrode over the entirety of the third region W3.

The p-side electrode covering layer 35 is provided to cover the p-side contact electrode 34. The p-side electrode covering layer 35 is provided to cover both an upper surface 34*a* and a side surface 34*b* of the p-side contact electrode 34. The p-side electrode covering layer 35 is formed to be directly in contact with the p-type semiconductor layer 28 at the outer circumference of the p-side contact electrode 34. The p-side electrode covering layer 35 is formed over the entirety of the interface between the p-side contact electrode 34 and the dielectric protective layer 42 and is formed to prevent the p-side contact electrode 34 and the dielectric protective layer 42 from being in direct contact. The p-side electrode covering layer 35 is made of titanium nitride (TiN) having conductivity. The conductivity of the p-side electrode covering layer 35 is $1 \times 10^{-5}$ $\Omega \cdot m$ or lower, and, for example, about $4 \times 10^{-7}$ $\Omega \cdot m$. The thickness of the p-side electrode covering layer 35 is 5 nm or larger and is, for example, about 10 nm-100 nm.

The n-side contact electrode 36 is provided on the second upper surface 24*b* of the n-type semiconductor layer 24. The n-side contact electrode 36 is provided in the second region W2 different from the first region W1 in which the active layer 26 is provided. The n-side contact electrode 36 is made of a material that can be in ohmic contact with the n-type semiconductor layer 24 and has a high reflectivity for the deep ultraviolet light emitted by the active layer 26. The n-side contact electrode 36 includes a titanium (Ti) layer 37 directly in contact with the n-type semiconductor layer 24 and an aluminum (Al) layer 38 directly in contact with the Ti layer 37.

The thickness of the Ti layer 37 is about 1 nm-10 nm and is preferably 5 nm or smaller, and, more preferably, 1 nm-2 nm. By configuring the Ti layer 37 to have a small thickness, the ultraviolet reflectivity of the n-side contact electrode 36 as viewed from the n-type semiconductor layer 24 can be increased. The thickness of the Al layer 38 is about 100 nm-1000 nm and is preferably 200 nm or larger. By configuring the Al layer to have a large thickness, the ultraviolet reflectivity of the n-side contact electrode 36 is increased.

The n-side contact electrode 36 is formed inside the second region W2. The region in which the n-side contact electrode 36 is formed is defined as "fourth region W4". The n-side contact electrode 36 is formed to be in ohmic contact with the n-type semiconductor layer 24 over the entirety of the fourth region W4. By using a Ti/Al layer as the n-side contact electrode 36, contact resistance of $1 \times 10^{-2}$ $\Omega \cdot cm^2$ or smaller (e.g., $1 \times 10^{-3}$ $\Omega \cdot cm^2$ or smaller) can be realized. The n-side contact electrode 36 is formed to result in high reflectivity for deep ultraviolet light over the entirety of the fourth region W4. By configuring the Ti layer 37 to have a small thickness, the reflectivity of 80% or higher (e.g., about 85%-90%) for ultraviolet light having a wavelength of 280 nm of the n-side contact electrode 36 can be obtained.

It is preferred that the n-side contact electrode 36 be formed evenly over the entirety of the fourth region W4. Stated otherwise, it is preferred that the Ti layer 37 and the Al layer 38 forming the n-side contact electrode 36 be stacked in a uniform thickness over the entirety of the fourth region W4. This allows the n-side contact electrode 36 to function as a highly efficient reflection electrode that reflects the ultraviolet light from the active layer 26 and guides it toward the second principal surface 20*b* of the substrate 20 and to function as a low-resistance contact electrode over the entirety of the fourth region W4. It is preferred that the n-side contact electrode 36 does not contain gold (Au), which could cause reduction in the ultraviolet reflectivity.

The n-side electrode covering layer 39 is provided to cover the n-side contact electrode 36. The n-side electrode covering layer 39 is provided to cover both an upper surface 36*a* and a side surface 36*b* of the n-side contact electrode 36. The n-side electrode covering layer 39 is formed to be directly in contact with the n-type semiconductor layer 24 at the outer circumference of the n-side contact electrode 36. The n-side electrode covering layer 39 is formed over the entirety of the interface between the n-side contact electrode 36 and the dielectric protective layer 42 and is formed to prevent the n-side contact electrode 36 and the dielectric protective layer 42 from being in direct contact. The n-side electrode covering layer 39 is made of titanium nitride (TiN) having conductivity. The conductivity of the n-side electrode covering layer 39 is $1 \times 10^{-5}$ $\Omega \cdot m$ or lower, and, for example, about $4 \times 10^{-7}$ $\Omega \cdot m$. The thickness of the n-side electrode covering layer 39 is 5 nm or larger and is, for example, about 10 nm-100 nm.

The dielectric protective layer 42 is provided to cover the second upper surface 24*b* of the n-type semiconductor layer 24, the side surface (also referred to as a mesa surface 12) of the active layer 26 and the p-type semiconductor layer 28, the surfaces (upper surface and side surface) of the p-side electrode covering layer 35, and the surfaces (upper surface and side surface) of the n-side electrode covering layer 39. FIG. 1 shows that the mesa surface 12 is perpendicular to the substrate 20. Alternatively, the mesa surface 12 may be sloped at a predetermined angle of slope with respect to the substrate 20. The angle of slope of the mesa surface 12 may be, for example, not less than 40° and less than 55°.

The dielectric protective layer 42 is made of a dielectric material such as silicon oxide ($SiO_2$), silicon oxynitride (SiON), silicon nitride (SiN), aluminum oxide ($Al_2O_3$), aluminum oxynitride (AlON), and aluminum nitride (AlN). The thickness of the dielectric protective layer 42 is, for example, 100 nm or larger, 200 nm or larger, or 300 nm or larger or 500 nm or larger. The thickness of the protective layer 42 is, for example, 2 µm or smaller, 1 µm or smaller, or 800 nm or smaller. By configuring the dielectric protective layer 42 to have a large thickness, the surfaces of the respective layers formed on the n-type semiconductor layer 24 are suitably covered and protected.

The dielectric protective layer 42 is made of a material having a lower refractive index for deep ultraviolet light than the active layer 26. The refractive index of the AlGaN-based semiconductor material forming the active layer 26 depends on the composition ratio and is about 2.1-2.56. Meanwhile, the refractive index of $SiO_2$ that could form the dielectric protective layer 42 for ultraviolet light having a wavelength of 280 nm is about 1.4, the refractive index of SiON for ultraviolet light having a wavelength of 280 nm is about 1.4-2.1, and the refractive index of $Al_2O_3$ for ultraviolet light having a wavelength of 280 nm is about 1.8. By providing the dielectric protective layer 42 having a low refractive index, a larger portion of ultraviolet light can be totally reflected at the interface between the active layer 26 and the dielectric protective layer 42 and guided toward the second principal surface 20*b* of the substrate 20 that is the light extraction surface. In the case of $SiO_2$, in particular, the refractive index difference from the active layer 26 is larger so that the reflection characteristic is further improved.

The dielectric protective layer 42 may be a monolayer or may be a multilayer structure. The dielectric protective layer 42 may, for example, include a first protective layer and a second protective layer covering the first protective layer. The first protective layer is in direct contact with the mesa surface 12 and has a tight structure having a high film density formed by using the atomic layer deposition (ALD) method. The first protective layer is made of, for example, aluminum oxide ($Al_2O_3$), which has an excellent moisture resistance. The thickness of the first protective layer can be 50 nm or smaller and, for example, about 10 nm-30 nm. The second protective layer is formed to be thicker than the first protective layer. The thickness of the second protective layer is 100 nm or larger and is, for example, about 500 nm-1000 nm. The second protective layer is made of $SiO_2$, SiON, SiN, AlON, or AlN and can be formed by a well-known technology such as chemical vapor deposition (CVD).

When the $Al_2O_3$ layer is formed by the ALD method, the first step of introducing an organic aluminum compound such as trimethylaluminium (TMA) and the second step of introducing an oxygen source such as an $O_2$ plasma, $O_3$, or $H_2O$ are alternately repeated. It may be ensured that the surface that should be covered by the $Al_2O_3$ layer is first covered by TMA, by performing the first step at the beginning. In other words, a damage, created by performing the second step at the beginning and resulting from an $O_2$ plasma gas-induced oxidation or etching of the surface that should be covered by the $Al_2O_3$ layer, may be prevented. In particular, a damage to the active layer 26 can be prevented by introducing TMA first when the first protective layer, which is in direct contact with the mesa surface 12, is formed.

The dielectric protective layer 42 may further include a third protective layer that covers the second protective layer described above. The third protective layer is made of a material different from a material of the second protective layer. The third protective layer functions to fill pin holes that could be produced in the second protective layer. The third protective layer is made of a nitride such as SiN and AlN and can be formed by a well-known technology such as CVD. In the case the first protective layer is made of $Al_2O_3$ and the second protective layer is made of $SiO_2$, for example, the third protective layer is made of SiN. The refractive index of the second protective layer for ultraviolet light is smaller than the refractive index of the first protective layer and the third protective layer for ultraviolet light. The refractive index of $SiO_2$ for ultraviolet light having a wavelength of 280 nm is 1.49, the refractive index of $Al_2O_3$ is 1.82, and the refractive index of SiN is 2.18. Therefore, the refractive index (1.49) of the second protective layer made of $SiO_2$ is smaller than the refractive index (1.82) of the first protective layer made of $Al_2O_3$ and smaller than the refractive index (2.18) of the third protective layer made of SiN. The refractive index of the third protective layer for ultraviolet light is larger than the refractive index of the first protective layer. The thickness of the third protective layer may be smaller than the thickness of the second protective layer and may be, for example, about 50 nm-200 nm. The thickness of the third layer may be larger than the thickness of the first protective layer. By configuring the dielectric protective layer 42 as a three-layer structure of $Al_2O_3/SiO_2/SiN$, protective function that offers excellent sealing performance and moisture resistance can be provided without complicating the manufacturing steps excessively.

The p-side pad electrode 44 and the n-side pad electrode 46 (generically referred to as pad electrodes) are portions bonded when the semiconductor light-emitting element 10 is mounted on a packaging substrate or the like. The p-side pad electrode 44 is provided on the p-side contact electrode 34. The p-side pad electrode 44 is in contact with the p-side electrode covering layer 35 in a p-side opening 42p that extends through the dielectric protective layer 42 and is electrically connected to the p-side contact electrode 34. The n-side pad electrode 46 is provided on the n-side contact electrode 36. The n-side pad electrode 46 is in contact with the n-side electrode covering layer 39 in an n-side opening 42n that extends through the dielectric protective layer 42 and is electrically connected to the n-side contact electrode 36.

From the perspective of providing resistance to corrosion, the pad electrodes 44, 46 are configured to contain Au. For example, the pad electrodes 44, 46 are comprised of a Ni/Au, Ti/Au, or Ti/Pt/Au stack structure. In the case the pad electrodes 44, 46 are bonded by gold-tin (AuSn), an AuSn layer embodying the metal joining member may be included in the pad electrodes 44, 46.

The p-side contact electrode 34 and the n-side contact electrode 36 are configured such that a difference between the positions of the upper surface 34a and the upper surface 36a of the respective electrodes in the direction of thickness is 100 nm or smaller, and, preferably, 50 nm or smaller. For example, the difference between the positions of the upper surface 34a of the p-side contact electrode 34 and of the upper surface 36a of the n-side contact electrode 36 in the direction of thickness is configured to be equal to or smaller than half, and, preferably, ¼ the thickness of the n-side contact electrode 36. In the illustrated example, the positions of the upper surface 34a of the p-side contact electrode 34 and of the upper surface 36a of the n-side contact electrode 36 in the direction of thickness are substantially the same, and the difference between the positions in the direction of thickness (i.e., height) is 50 nm or smaller. By aligning the positions of the upper surfaces 34a, 36a of the p-side contact electrode 34 and the n-side contact electrode 36 in the direction of thickness (i.e., height) to each other, it is easy to align the positions of the upper surfaces of the p-side pad electrode 44 and of the n-side pad electrode 46 in the direction of thickness (i.e., height) to each other. This inhibits a tilt of the semiconductor light-emitting element 10 resulting from a difference between the height positions of the p-side pad electrode 44 and of the n-side pad electrode 46 from occurring when the semiconductor light-emitting element 10 is bonded to a packaging substrate or the like. By inhibiting a tilt of the semiconductor light-emitting element 10 mounted on a packaging substrate, exfoliation of the semiconductor light-emitting element 10 from the packaging substrate is prevented.

Figure 2:
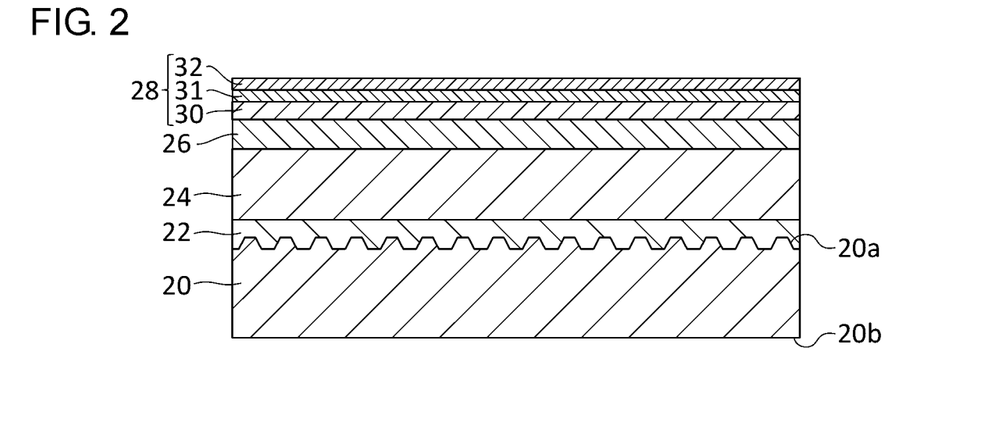
FIG. 2 schematically shows a step of manufacturing the semiconductor light-emitting element.

A description will now be given of a method of manufacturing the semiconductor light-emitting element 10. FIGS. 2-8 schematically show steps of manufacturing the semiconductor light-emitting element 10. Referring to FIG. 2, the base layer 22, the n-type semiconductor layer 24, the active layer 26, the p-type semiconductor layer 28 (the p-type first clad layer 30, the p-type second clad layer 31, and the p-type contact layer 32) are first formed on the first principal surface 20a of the substrate 20 successively.

The substrate 20 is a patterned sapphire substrate and is a growth substrate for forming an AlGaN-based semiconductor material. The base layer 22 includes, for example, an AlN (HT-AlN) layer grown at a high temperature and an undoped AlGaN (u-AlGaN) layer. The n-type semiconductor layer 24, the active layer 26, and the p-type semiconductor layer 28 are layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

Figure 3:
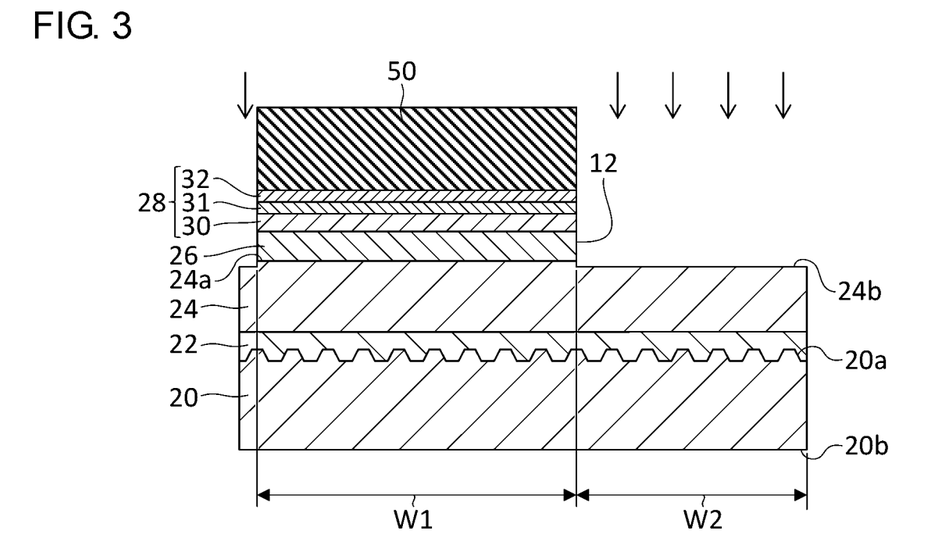
FIG. 3 schematically shows a step of manufacturing the semiconductor light-emitting element.

Subsequently, as shown in FIG. 3, a mask 50 is formed in the first region W1 on the p-type semiconductor layer 28, and the p-type semiconductor layer 28 and the active layer 26 are removed by dry-etching from above the mask 50. The mask 50 can be formed by using, for example, a publicly known photolithographic technology. The dry-etching is performed until the n-type semiconductor layer 24 is exposed in the second region W2. In this way, the second upper surface 24b of the n-type semiconductor layer 24 is formed. The active layer 26 and the p-type semiconductor layer 28 having the mesa surface 12 are formed in the first region W1. For example, reactive ion etching using an etching gas turned into a plasma can be used in the step of forming the mesa surface 12. For example, inductive coupling plasma (ICP) etching may be used. The mask 50 is removed after the dry-etching is performed.

Figure 4:
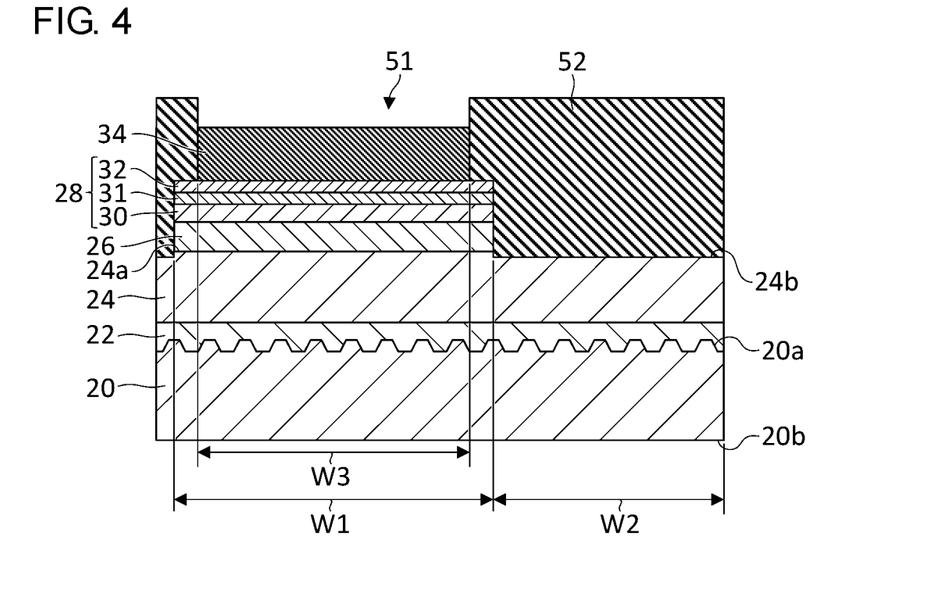
FIG. 4 schematically shows a step of manufacturing the semiconductor light-emitting element.

Subsequently, as shown in FIG. 4, a mask 52 having an opening 51 in the third region W3 is formed, and the p-side contact electrode 34 is formed in the third region W3 on the p-type semiconductor layer 28. The mask 52 can be formed by using, for example, a publicly known photolithographic technology. The p-side contact electrode 34 can be formed by sputtering or electron beam (EB) deposition. Proper ohmic contact can be established between the p-type semiconductor layer 28 and the p-side contact electrode 34 by forming the p-side contact electrode 34 on the p-type semiconductor layer 28 immediately after the mesa surface 12 is formed. The p-side contact electrode 34 is annealed after the p-side contact electrode 34 is formed and the mask 52 is removed.

Figure 5:
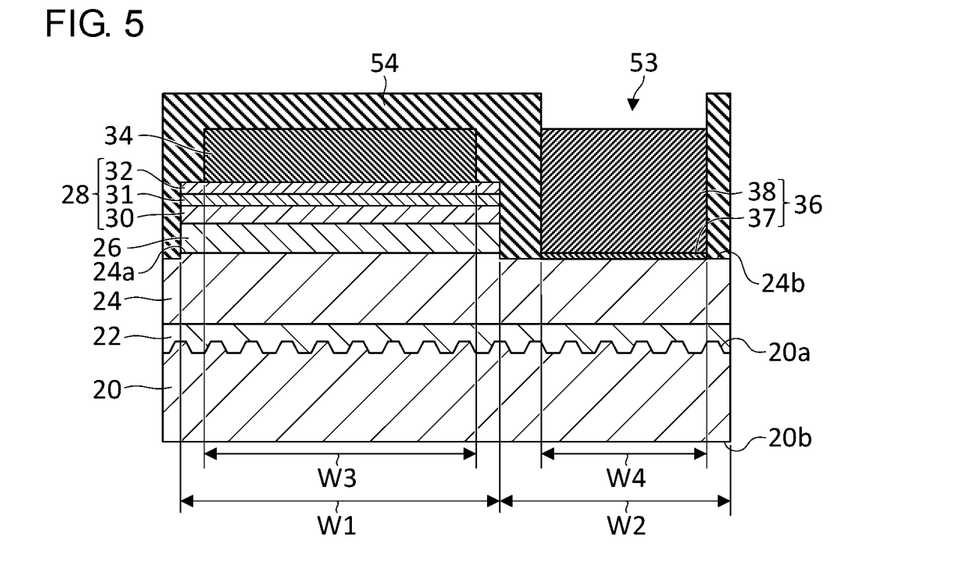
FIG. 5 schematically shows a step of manufacturing the semiconductor light-emitting element.

Subsequently, as shown in FIG. 5, a mask 54 having an opening 53 in the fourth region W4 is formed, and the n-side contact electrode 36 is formed in the fourth region W4 on the second upper surface 24b of the n-type semiconductor layer 24. The mask 54 can be formed by using, for example, a publicly known photolithographic technology. First, the Ti layer 37 is formed on the second upper surface 24b of the n-type semiconductor layer 24, and the Al layer 38 is formed on the Ti layer 37. These layers are formed by sputtering or EB deposition. By forming these layers by sputtering, metal layers having a lower film density can be formed than by using EB deposition, and excellent contact resistance is realized at a relatively low annealing temperature.

The mask 54 is then removed, and the n-side contact electrode 36 is annealed. The n-side contact electrode 36 is preferably annealed at a temperature below the melting point of Al (about 660° C.) and is preferably annealed at a temperature not lower than 560° C. and not higher than 650° C. The film density of the Al layer 38 of less than 2.7 g/cm$^3$ and the annealing temperature of not lower than 560° C. and not higher than 650° C. ensure that the contact resistance of the n-side contact electrode 36 is $1 \times 10^{-2}$ Ω·cm$^2$ or smaller. The annealing temperature of not lower than 560° C. and not higher than 650° C. enhances the post-annealing flatness of the n-side contact electrode 36 and provides a ultraviolet reflectivity of 80% or higher.

Figure 6:
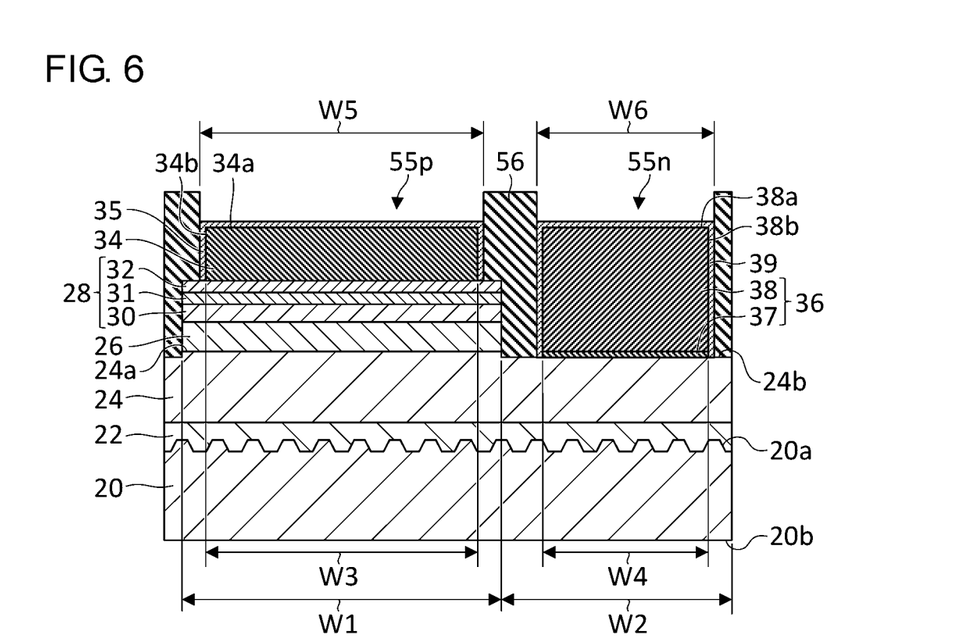
FIG. 6 schematically shows a step of manufacturing the semiconductor light-emitting element.

Subsequently, as shown in FIG. 6, a mask 56 having a first opening 55p in a fifth region W5 and having a second opening 55n in a sixth region W6 is formed. The mask 56 can be formed by using, for example, a publicly known photolithographic technology. Subsequently, the p-side electrode covering layer 35 that covers the p-side contact electrode 34 is formed in the first opening 55p, and the n-side electrode covering layer 39 that covers the n-side contact electrode 36 is formed in the second opening 55n. The fifth region W5 in which the p-side electrode covering layer 35 is formed is narrower than the first region W1 but larger than the third region W3. This allows formation of the p-side electrode covering layer 35 that covers both the upper surface 34a and the side surface 34b of the p-side contact electrode 34. Similarly, the sixth region W6 in which the n-side electrode covering layer 39 is formed is narrower than the second region W2 but larger than the fourth region W4. This allows formation of the n-side electrode covering layer 39 that covers both the upper surface 36a and the side surface 36b of the n-side contact electrode 36.

The p-side electrode covering layer 35 and the n-side electrode covering layer 39 are conductive TiN layers and can be formed by, for example, reactive sputtering. The p-side electrode covering layer 35 and the n-side electrode covering layer 39 are formed concurrently in the same step by using the mask 56. After the p-side electrode covering layer 35 and the n-side electrode covering layer 39 are formed, the mask 56 is removed. The p-side electrode covering layer 35 and the n-side electrode covering layer 39 may be formed in separate steps.

Figure 7:
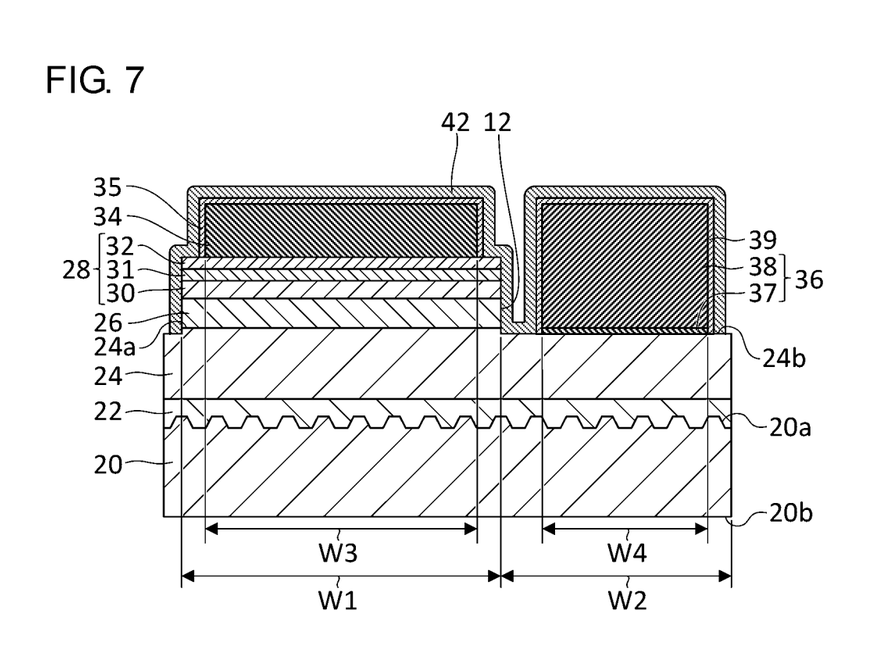
FIG. 7 schematically shows a step of manufacturing the semiconductor light-emitting element.

Subsequently, the dielectric protective layer 42 is formed as shown in FIG. 7. The dielectric protective layer 42 is formed to cover the entirety of the upper surface of the element structure. The dielectric protective layer 42 is provided to cover the surfaces (upper surfaces and side surfaces) of the p-side electrode covering layer 35 and the n-side electrode covering layer 39 and to cover the exposed surfaces of the active layer 26 and the p-type semiconductor layer 28 including the mesa surface 12. The dielectric protective layer 42 is provided to cover at least a part of the second upper surface 24b of the n-type semiconductor layer 24. The dielectric protective layer 42 may be a monolayer or a stack of a plurality of protective layers. In the case the dielectric protective layer 42 includes a plurality of protective layers, the first protective layer may be formed, and then the second protective layer may be formed to cover the first protective layer. Further, the third protective layer may be formed to cover the second protective layer.

Figure 8:
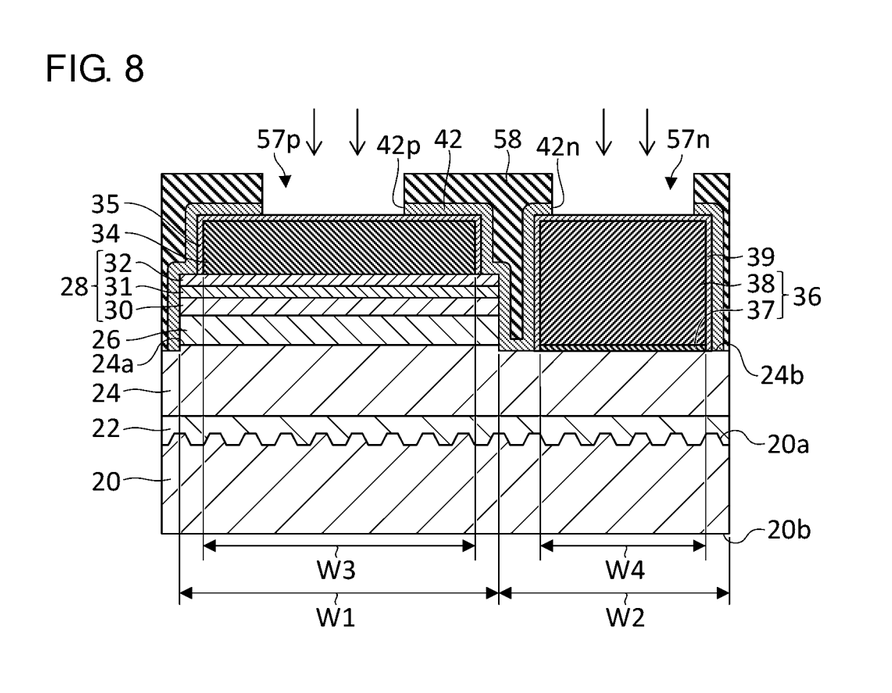
FIG. 8 schematically shows a step of manufacturing the semiconductor light-emitting element.

Subsequently, as shown in FIG. 8, a mask 58 having openings 57p, 57n is formed, and the p-side opening 42p and the n-side opening 42n are formed by removing a portion of the dielectric protective layer 42. The mask 58 can be formed by using, for example, a publicly known photolithographic technology. The openings 57p, 57n of the mask 58 are positioned above the p-side contact electrode 34 and the n-side contact electrode 36. A portion of the dielectric protective layer 42 can be removed by dry-etching using a fluorine-based etching gas such as a hexafluoroethane ($C_2F_6$) gas. In this dry-etching step, TiN that forms the p-side electrode covering layer 35 and the n-side electrode covering layer 39 functions as a stop layer for the dry-etching. TiN is not so reactive to a fluorine-based etching gas so that by-products from etching are not easily produced. It is therefore ensured that the exposed surface of the A-side electrode covering layer 35 and the n-side electrode covering layer 39 has a high quality even after dry-etching. Also, a damage to the p-side contact electrode 34 and the n-side contact electrode 36 can be prevented, and the low-resistance and high-reflectivity contact electrode can be maintained.

In the case the dielectric protective layer 42 includes a plurality of protective layers, masks for dry-etching the plurality of protective layers respectively may be separately formed. In the case the dielectric protective layer 42 includes the first protective layer, the second protective layer, and the third protective layer, the first mask for dry-etching the third protective layer is first formed. The third protective layer is dry-etched by using the first mask, and the third opening is formed in the third protective layer so that the second protective layer is exposed. The first mask is removed after the third protective layer is dry-etched. The second mask for dry-etching the second protective layer is then formed. The second mask is formed to cover the third protective layer completely and to cover the side wall in the third opening of the third protective layer. Therefore, the aperture size of the second mask is smaller than the aperture size of the third opening. The second protective layer is then dry-etched by using the second mask, and the second opening is formed in the second protective layer so that the first protective layer is exposed. The aperture size of the second opening is smaller than the aperture size of the third opening. The second mask is removed after the second protective layer is dry-etched. The third mask for dry-etching the first protective layer is then formed. The third mask is formed to cover the second protective layer and the third protective layer completely and to cover the side wall in the second opening of the second protective layer and the side wall in the third opening of the third protective layer. The first protective layer is then dry-etched by using the third mask, and the first opening is formed so that the p-side electrode covering layer 35 and the n-side electrode covering layer 39 are exposed. The aperture size of the first opening is smaller than the aperture size of the second opening and the third opening. The third mask is removed after the first protective layer is dry-etched. In this way, the p-side opening 42p and the n-side opening 42n in which the first opening, the second opening, and the third opening communicate with each other, is formed.

Subsequently, the p-side pad electrode 44 is formed in the p-side opening 42p on the p-side electrode covering layer 35, and the n-side pad electrode 46 is formed in the n-side opening 42n on the n-side electrode covering layer 39. For example, the pad electrodes 44, 46 can be formed by first depositing a Ni layer or a Ti layer and then depositing an Au layer thereon. A further, different metal layer may be provided on the Au layer. For example, an Sn layer, an AuSn layer, or a stack structure of Sn/Au may be formed. The pad electrodes 44, 46 may be formed by using the mask 58 or formed by using further resist mask different than the mask 58. After the pad electrodes 44, 46 are formed, the mask 58 or the further resist mask is removed. The semiconductor light-emitting element 10 shown in FIG. 1 is completed through the steps described above.

According to the embodiment, the electrode covering layers 35, 39 made of TiN are provided between the contact electrodes 34, 36 and the dielectric protective layer 42, respectively. Therefore, the adhesion of the dielectric protective layer 42 with the contact electrodes 34, 36 can be enhanced. In particular, the adhesion of Rh, which forms the p-side contact electrode 34, with dielectric materials such as oxides, oxynitrides, and nitrides of silicon or aluminum is not great. In the case of a structure in which the dielectric protective layer 42 is in direct contact with the p-side contact electrode 34, therefore, the dielectric protective layer 42 is easily exfoliated from the p-side contact electrode 34, and the sealing performance exhibited by the dielectric protective layer 42 such as insulation quality and moisture resistance is lowered. Meanwhile, the adhesion of TiN with the dielectric protective layer 42 is good. The adhesion of TiN with the contact electrodes 34, 36 is also excellent. By providing the electrode covering layers 35, 39 made of TiN, therefore, exfoliation of the dielectric protective layer 42 is prevented, and the sealing performance exhibited by the dielectric protective layer 42 is prevented from being lowered. In this way, the reliability of the semiconductor light-emitting element 10 can be increased.

It is also conceivable to use metals such as titanium (Ti) and platinum (Pt) may be used in the electrode covering layers 35, 39. Ti is a material having a good adhesion with the dielectric protective layer 42 but may react with a fluorine-based etching gas used to dry-etch the dielectric protective layer 42 and produce corrosion or by-products. As a result, electric connection with the pad electrodes 44, 46 may become poor, and the contact electrodes 34, 36 may be damaged. Platinum group metals such as Pt does not react with a fluorine-based etching gas used to dry-etch the dielectric protective layer 42 but the adhesion with the dielectric protective layer 42 is not great and so cannot prevent exfoliation of the dielectric protective layer 42. The requirements for resistance to corrosion by dry-etching and for adhesion with the dielectric protective layer 42 can both be met by using conductive TiN in the electrode covering layer 35, 39. Further, TiN is excellent in moisture resistance so that the moisture resistance of the contact electrodes 34, 36 can also be increased.

Described above is an explanation based on an exemplary embodiment. The embodiment is intended to be illustrative only and it will be understood by those skilled in the art that various design changes are possible and various modifications are possible and that such modifications are also within the scope of the present invention.

A description is given above of the manufacturing method in which the p-side contact electrode 34 shown in FIG. 4 is formed after the mesa surface 12 shown in FIG. 3 is formed. In an alternative embodiment, the p-side contact electrode 34 may be formed before the mesa surface 12 is formed. In that case, the base layer 22, the n-type semiconductor layer 24, the active layer 26, and the p-type semiconductor layer 28 are formed on the substrate 20, and the p-side contact electrode 34 is formed in a partial region (third region W3) on the p-type semiconductor layer 28. Subsequently, the mesa surface 12 is formed by forming a mask on the p-type semiconductor layer 28 and the p-side contact electrode 34 and dry-etching the active layer 26 and the p-type semiconductor layer 28 in a region (second region W2) in which the p-side contact electrode 34 is not formed. The p-side contact electrode 34 may be annealed before the mesa surface 12 is formed or after it is formed. By performing the steps shown in FIGS. 5-8 subsequently, the semiconductor light-emitting element 10 shown in FIG. 1 is completed.

What is claimed is:
1. A semiconductor light-emitting element comprising:
an n-type semiconductor layer made of an n-type AlGaN-based semiconductor material;
an active layer made of an AlGaN-based semiconductor material provided on the n-type semiconductor layer;
a p-type semiconductor layer provided on the active layer;
a p-side contact electrode made of Rh and in contact with the p-type semiconductor layer;
a p-side electrode covering layer made of TiN that covers the p-side contact electrode;

a dielectric protective layer that covers the n-type semiconductor layer, the active layer, the p-type semiconductor layer, and the p-side electrode covering layer; and a p-side pad electrode in contact with the p-side electrode covering layer in a p-side opening that extends through the dielectric protective layer on the p-side contact electrode, wherein the p-side electrode covering layer covers an upper surface and a side surface of the p-side contact electrode and is in contact with the p-type semiconductor layer, wherein the semiconductor light-emitting element, further comprising an n-side contact electrode provided in a region on the n-type semiconductor layer different from a region in which the active layer is formed; an n-side electrode covering layer made of TiN that covers the n-side contact electrode; and an n-side pad electrode in contact with the n-side electrode covering layer in an n-side opening that extends through the dielectric protective layer on the n-side contact electrode.

2. The semiconductor light-emitting element according to claim 1, wherein
the p-side electrode covering layer is formed over an entirety of an interface between the p-side contact electrode and the dielectric protective layer.

3. The semiconductor light-emitting element according to claim 1, wherein
a difference between positions of an upper surface of the p-side contact electrode and an upper surface of the n-side contact electrode in a direction of thickness is 100 nm or smaller.

4. The semiconductor light-emitting element according to claim 1, further comprising:
a patterned sapphire substrate in which a concave-convex pattern is formed on a principal surface, wherein
the n-type semiconductor layer is provided on the principal surface of the patterned sapphire substrate.

5. A method of manufacturing a semiconductor light-emitting element, comprising:

forming an active layer made of an AlGaN-based semiconductor material on an n-type semiconductor layer made of an n-type AlGaN-based semiconductor material;

forming a p-type semiconductor layer on the active layer;

removing a portion of the p-type semiconductor layer and the active layer to expose a partial region on the n-type semiconductor layer;

forming a p-side contact electrode made of Rh on the p-type semiconductor layer;

forming a p-side electrode covering layer made of TiN that covers the p-side contact electrode;

forming a dielectric protective layer that covers the n-type semiconductor layer, the active layer, the p-type semiconductor layer, and the p-side electrode covering layer; and forming a p-side opening that extends through the dielectric protective layer on the p-side contact electrode; and forming a p-side pad electrode in contact with the p-side electrode covering layer in the p-side opening, wherein the method further comprising forming an n-side contact electrode in the partial region on the n-type semiconductor layer; forming an n-side electrode covering layer made of TiN that covers the n-side contact electrode; forming an n-side opening that extends through the dielectric protective layer on the n-side contact electrode;

And forming an n-side pad electrode in contact with the n-side electrode covering layer in the n-side opening, wherein the p-side electrode covering layer and the n-side electrode covering layer are formed concurrently.

6. The method of manufacturing a semiconductor light-emitting element according to claim 5, wherein
the p-side electrode covering layer is formed by sputtering.

* * * * *